United States Patent
Park

(10) Patent No.: US 9,893,032 B2
(45) Date of Patent: Feb. 13, 2018

(54) FOG BONDING DEVICE AND METHOD THEREOF

(71) Applicant: Hydis Technologies Co., Ltd., Gyeonggi-do (KR)

(72) Inventor: Young Hwan Park, Gyeonggi-do (KR)

(73) Assignee: Hydis Technologies Co., Ltd. (KR)

( * ) Notice: Subject to any disclaimer, the term of this patent is extended or adjusted under 35 U.S.C. 154(b) by 0 days.

(21) Appl. No.: 15/009,871

(22) Filed: Jan. 29, 2016

(65) Prior Publication Data

US 2016/0225736 A1 Aug. 4, 2016

(30) Foreign Application Priority Data

Jan. 30, 2015 (KR) .................. 10-2015-0015137

(51) Int. Cl.
| | |
|---|---|
| *H01L 21/00* | (2006.01) |
| *H01L 23/00* | (2006.01) |
| *H01L 23/498* | (2006.01) |
| *H01L 21/48* | (2006.01) |
| *H01L 27/12* | (2006.01) |

(52) U.S. Cl.
CPC ............. *H01L 24/75* (2013.01); *H01L 21/48* (2013.01); *H01L 23/4985* (2013.01); *H01L 27/1259* (2013.01)

(58) Field of Classification Search
CPC ......... H01L 24/75; H01L 24/84; H01L 21/48; H01L 23/4985; H01L 27/1259
See application file for complete search history.

(56) References Cited

U.S. PATENT DOCUMENTS

2003/0168439 A1* 9/2003 Kanno ................ H01L 21/6831
  219/390
2005/0011068 A1* 1/2005 Yuzawa ................ H01L 24/81
  29/740

FOREIGN PATENT DOCUMENTS

| JP | 08-106102 A | 4/1996 |
| JP | 2008-244255 | * 10/2008 |
| KR | 10-2014-0072325 A | 6/2014 |

* cited by examiner

*Primary Examiner* — Dale E. Page
*Assistant Examiner* — Quovaunda V Jefferson
(74) *Attorney, Agent, or Firm* — Mayback & Hoffman, P.A.; Gregory L. Mayback

(57) ABSTRACT

A bonding device and bonding method for bonding an FPC film on a display panel through an anisotropic conductor attached to the display panel, the device including a panel supporting unit configured to support the display panel; a heating and pressurizing unit disposed on an upper area of the panel supporting unit and configured to pressurize and heat a compression area of the FPC film placed on an upper part of the anisotropic conductor towards the display panel, a film supporting unit disposed adjacent the panel supporting unit and configured to support the FPC film, and a film pre-heating unit provided in the film supporting unit and configured to pre-heat the FPC film.

2 Claims, 4 Drawing Sheets

PRIOR ART

FOG BONDING DEVICE AND METHOD THEREOF

CROSS-REFERENCE TO RELATED APPLICATIONS

This application claims the priority, under 35 U.S.C. §§ 119 and 371, of Korean patent Application No. 10-2015-0015137, filed Jan. 30, 2015; the prior application is herewith incorporated by reference in its entirety.

STATEMENT REGARDING FEDERALLY SPONSORED RESEARCH OR DEVELOPMENT

Not Applicable

FIELD OF THE INVENTION

The present systems and methods lies in the field of bonding. The present disclosure relates to a bonding device and a bonding method thereof, and more particularly, to a bonding device for bonding a Flexible Printed Circuit (FPC) film on a display panel, and a bonding method thereof.

BACKGROUND OF THE INVENTION

In general, processes for producing a flat panel display such as a Liquid Crystal Display (LCD) and Plasma Display Panel (PDP) comprise Chip On Glass (COG) bonding processes or Film On Glass (FOG) bonding processes.

A COG bonding process is a process for bonding a chip such as a driver IC and the like on a panel. In such a COG bonding process, an Anisotropic Conductive Film (ACF) is attached to a portion of a panel where a chip for COG purpose is to be placed, and then the COG chip is bonded through pre-bonding and main bonding.

Once the COG chip is bonded accordingly, an indentation inspection and crack inspection are performed on the COG chip regarding the panel.

On the other hand, the FOG bonding process is a process for bonding an FPC film on a panel. In such an FOG bonding process, an ACF conductor is attached to a portion of a panel where an FPC film is to be placed, and then the FPC film is bonded to the panel by pressurizing and heating the FPC film.

However, when pressurizing and heating the FPC film, a temperature variation occurs between a dummy lead and real lead provided on the FPC film, which is a problem.

FIG. 1 is a view illustrating an FPC film where a dummy lead and real lead are provided.

As illustrated in FIG. 1, due to a difference of length between the dummy lead D and real lead R provided on the FPC film F, the heat applied to a compression area G (area that is subject to pressurization and heating) of the FPC film F is conducted to a non-compression area via the real lead R, and, therefore, a thermal loss occurs.

Such a thermal loss causes a temperature variation, that is, a temperature difference between the dummy lead D and real lead R in the compression area G of the FPC film F when bonding the FPC film F.

Such a temperature variation between the dummy lead D and real lead R in the compression area G of the FPC film F causes a bonding defect to occur.

Thus, a need exists to overcome the problems with the prior art systems, designs, and processes as discussed above.

SUMMARY OF THE INVENTION

Therefore, a purpose of the present disclosure is to resolve the aforementioned problems of prior art, that is, to provide a bonding device and bonding method capable of preventing a temperature variation between a dummy lead and real lead in a compression area by preventing a thermal loss from occurring through the real lead when heating and compressing an FPC film.

The aforementioned purpose may be achieved by a bonding device and bonding method according to the present disclosure.

According to an aspect, there is provided a bonding device for bonding an FPC film on a display panel through an anisotropic conductor attached to the display panel, the device including a panel supporting unit configured to support the display panel, a heating and pressurizing unit disposed on an upper area of the panel supporting unit and configured to pressurize and heat a compression area of the FPC film placed on an upper part of the anisotropic conductor towards the display panel, a film supporting unit disposed adjacent the panel supporting unit and configured to support the FPC film, and a film pre-heating unit provided in the film supporting unit and configured to pre-heat the FPC film.

Herein, film pre-heating unit may include a heating unit and a pre-heating temperature adjustment unit configured to adjust a heating temperature of the heating unit.

The film pre-heating unit may pre-heat a non-compression area of the FPC film.

The film pre-heating unit may pre-heat a real lead that extends from the compression area to the non-compression area.

A pre-heating temperature of the film pre-heating unit may be lower than a heating temperature of the heating and pressurizing unit.

According to another aspect, there is provided a bonding method including attaching an anisotropic conductor to a display panel, mounting the display panel on a panel supporting unit, mounting an FPC film on the film supporting unit, and positioning a compression area of the FPC film on an upper part of the anisotropic conductor, pre-heating the FPC film mounted on the film supporting unit, and compressing the FPC film by heating and pressurizing the compression area of the FPC film.

At the step of pre-heating the FPC film, a non-compression area of the FPC film may be pre-heated.

At the step of pre-heating the FPC film, a real lead that extends from the compression area to the non-compression area may be pre-heated.

At the step of pre-heating the FPC film, a pre-heating temperature of the FPC film may be lower than a heating temperature of the FPC film at the step of compressing the FPC film.

According to the present disclosure, it is possible to provide a bonding device capable of improving the bonding qualities by having a film pre-heating unit configured to pre-heat an FPC film so that a temperature variation does not occur between a dummy lead and real lead provided on the FPC film when heating a compression area of the FPC film using a heating and pressurizing unit.

Although the systems and methods are illustrated and described herein as embodied in a a bonding device and bonding method capable of preventing a temperature variation between a dummy lead and real lead in a compression area by preventing a thermal loss from occurring through the real lead when heating and compressing an FPC film, it is, nevertheless, not intended to be limited to the details shown because various modifications and structural changes may be made therein without departing from the spirit of the invention and within the scope and range of equivalents of the claims. Additionally, well-known elements of exemplary embodiments will not be described in detail or will be omitted so as not to obscure the relevant details of the systems and methods.

Additional advantages and other features characteristic of the systems and methods will be set forth in the detailed description that follows and may be apparent from the detailed description or may be learned by practice of exemplary embodiments. Still other advantages of the systems and methods may be realized by any of the instrumentalities, methods, or combinations particularly pointed out in the claims.

Other features that are considered as characteristic for the systems and methods are set forth in the appended claims. As required, detailed embodiments of the systems and methods are disclosed herein; however, it is to be understood that the disclosed embodiments are merely exemplary of the systems and methods, which can be embodied in various forms. Therefore, specific structural and functional details disclosed herein are not to be interpreted as limiting, but merely as a basis for the claims and as a representative basis for teaching one of ordinary skill in the art to variously employ the systems and methods in virtually any appropriately detailed structure. Further, the terms and phrases used herein are not intended to be limiting; but rather, to provide an understandable description of the systems and methods. While the specification concludes with claims defining the systems and methods of the invention that are regarded as novel, it is believed that the systems and methods will be better understood from a consideration of the following description in conjunction with the drawing figures, in which like reference numerals are carried forward.

BRIEF DESCRIPTION OF THE DRAWINGS

The accompanying figures, where like reference numerals refer to identical or functionally similar elements throughout the separate views, which are not true to scale, and which, together with the detailed description below, are incorporated in and form part of the specification, serve to illustrate further various embodiments and to explain various principles and advantages all in accordance with the systems and methods. Advantages of embodiments of the systems and methods will be apparent from the following detailed description of the exemplary embodiments thereof, which description should be considered in conjunction with the accompanying drawings in which.

DETAILED DESCRIPTION OF THE EMBODIMENTS

Figure 1:
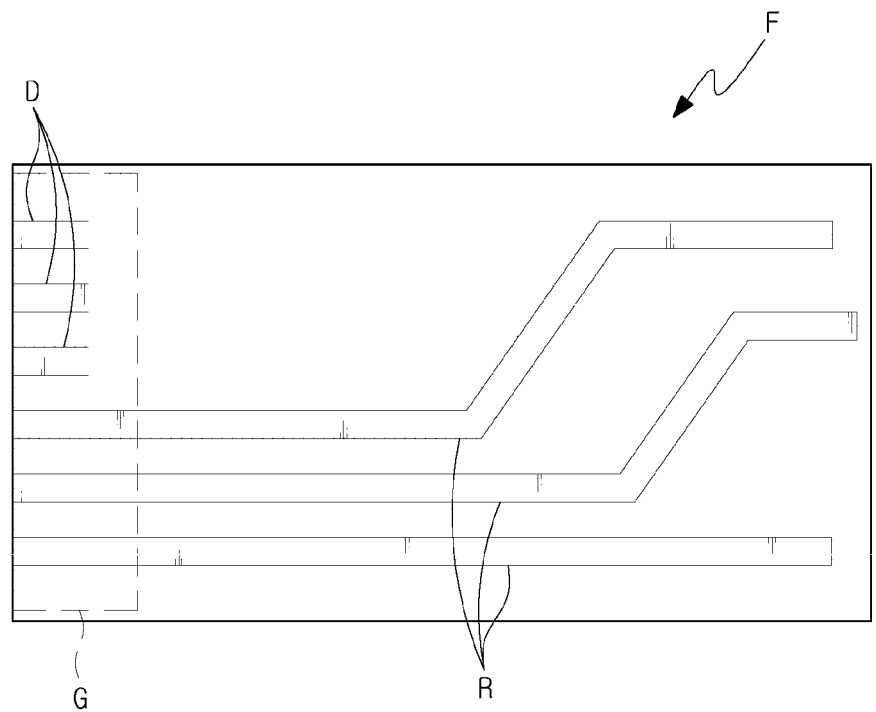
FIG. 1 is a plan view of a prior art FPC film on which a dummy lead and real lead are provided.

As required, detailed embodiments of the systems and methods are disclosed herein; however, it is to be understood that the disclosed embodiments are merely exemplary of the systems and methods, which can be embodied in various forms. Therefore, specific structural and functional details disclosed herein are not to be interpreted as limiting, but merely as a basis for the claims and as a representative basis for teaching one skilled in the art to variously employ the systems and methods in virtually any appropriately detailed structure. Further, the terms and phrases used herein are not intended to be limiting; but rather, to provide an understandable description of the systems and methods. While the specification concludes with claims defining the features of the systems and methods that are regarded as novel, it is believed that the systems and methods will be better understood from a consideration of the following description in conjunction with the drawing figures, in which like reference numerals are carried forward.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Alternate embodiments may be devised without departing from the spirit or the scope of the invention. Additionally, well-known elements of exemplary embodiments of the systems and methods will not be described in detail or will be omitted so as not to obscure the relevant details of the systems and methods.

Before the systems and methods are disclosed and described, it is to be understood that the terminology used herein is for the purpose of describing particular embodiments only and is not intended to be limiting. The terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element. The terms "including" and/or "having," as used herein, are defined as comprising (i.e., open language). The terms "a" or "an", as used herein, are defined as one or more than one. The term "plurality," as used herein, is defined as two or more than two. The term "another," as used herein, is defined as at least a second or more. The description may use the terms "embodiment" or "embodiments," which may each refer to one or more of the same or different embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact (e.g., directly coupled). However, "coupled" may also mean that two or more elements are not in direct contact with each other, but yet still cooperate or interact with each other (e.g., indirectly coupled).

For the purposes of the description, a phrase in the form "A/B" or in the form "A and/or B" or in the form "at least one of A and B" means (A), (B), or (A and B), where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables, for example, a phrase in the form "at least one of A, B, and C" means (A), (B), (C), (A and B), (A and C), (B and C), or (A, B and C).

Relational terms such as first and second, top and bottom, and the like may be used solely to distinguish one entity or action from another entity or action without necessarily requiring or implying any actual such relationship or order between such entities or actions. The description may use perspective-based descriptions such as up/down, back/front, and top/bottom. Such descriptions are merely used to facilitate the discussion and are not intended to restrict the application of disclosed embodiments. Various operations may be described as multiple discrete operations in turn, in a manner that may be helpful in understanding embodiments; however, the order of description should not be construed to imply that these operations are order dependent.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure.

Herein various exemplary embodiments of the systems and methods are described. In many of the different embodiments, features are similar. Therefore, to avoid redundancy, repetitive description of these similar features may not be made in some circumstances. It shall be understood, however, that description of a first-appearing feature applies to the later described similar feature and each respective description, therefore, is to be incorporated therein without such repetition.

In explaining various embodiments of the present disclosure, a representative embodiment will be explained using like reference numerals to indicate the like components, and in explaining other embodiments, components that are different from the first embodiment will be explained.

Hereinafter, a bonding device and a bonding method according to an exemplary embodiment of the present disclosure will be explained in detail with reference to the drawings attached. Referring now to the figures of the drawings in detail and first, particularly to FIG. 2, there is shown a view schematically illustrating a configuration of a bonding device according to an exemplary embodiment of the present disclosure, and FIG. 3 is a view illustrating a state where the FPC film of FIG. 2 is supported by a film supporting unit.

Figure 2:
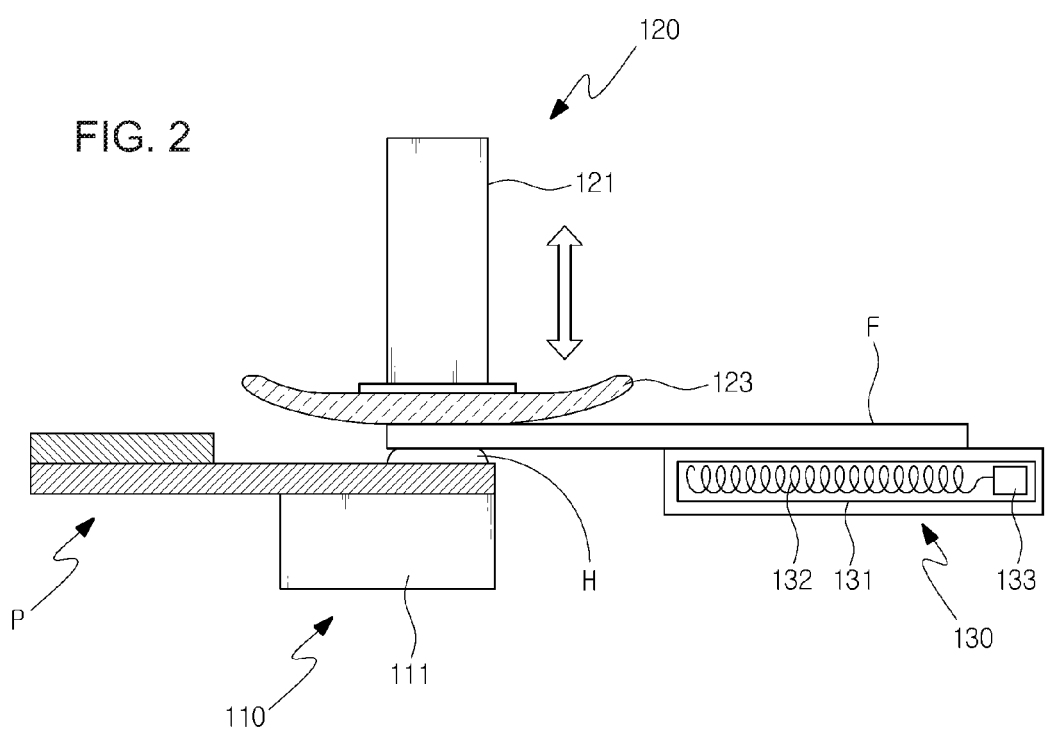
FIG. 2 is a fragmentary, partially cross-sectional view of a schematically illustration of a bonding device configuration according to an exemplary embodiment of the present disclosure.
Figure 3:
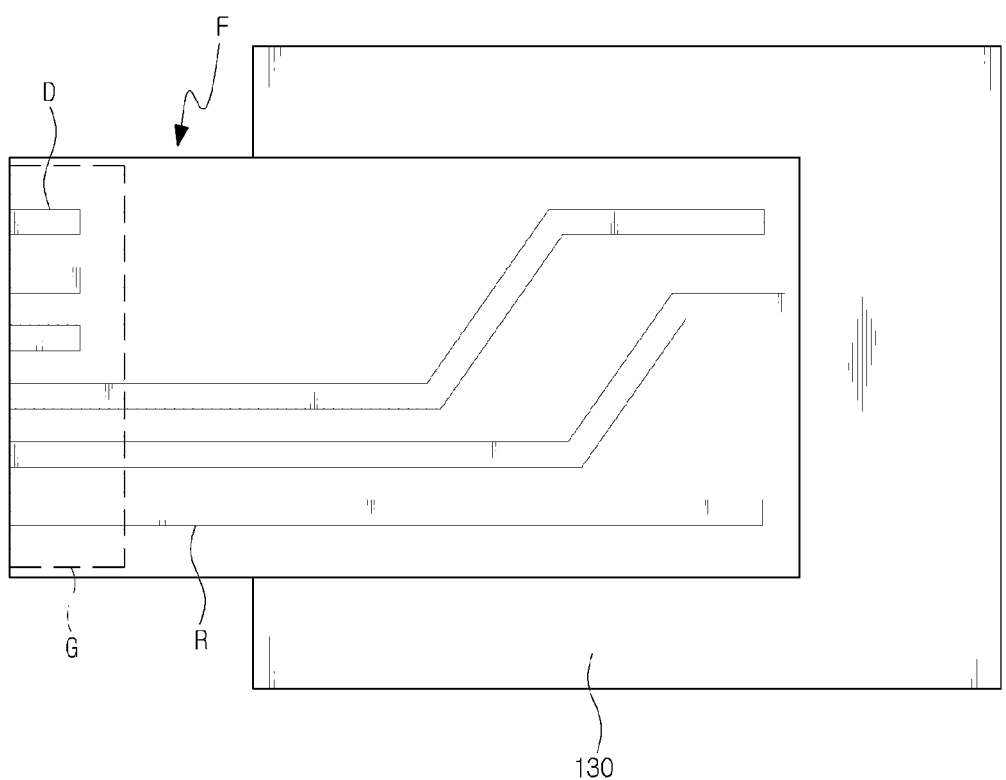
FIG. 3 is a plan view of the FPC film of FIG. 2 in a state where the FPC film is supported by a film supporting unit.

As illustrated in FIGS. 2 and 3, a bonding device according to the present exemplary embodiment bonds an FPC film F on a display panel P (hereinafter referred to as "panel") through an anisotropic conductor H attached to the panel P.

Such a bonding device includes a panel supporting unit 110 configured to support the panel P, a heating and pressurizing unit 120 disposed on an upper area of the panel supporting unit 110 and configured to heat and pressurize a compression area G of the FPC F disposed on an upper part of the anisotropic conductor H towards the panel P, a film supporting unit 130 disposed near the panel supporting unit 110 and configured to support the FPC film F, and a film pre-heating unit 131 in the film supporting unit 130 and configured to pre-heat the FPC film F to prevent a temperature variation between a dummy lead D and real lead R provided on the FPC film F when heating the compression area G by the heating and pressurizing unit 120.

Herein, the anisotropic conductor H is a thermosetting resin for bonding purpose, the thermosetting resin including a conductive ball (not illustrated) configured to electrically connect the real lead R of the FPC film F and a pad (not illustrated) of the panel P.

The panel supporting unit 110 supports the panel P. Such a panel supporting unit 110 has a base plate 111 on which the panel P is to be placed.

The heating and pressurizing unit 120 is disposed on an upper area of the panel supporting unit 110, and heats and pressurizes the compression area G of the FPC film F disposed on an upper part of the anisotropic conductor H towards the panel P. Herein, the compression area G of the FPC film F is a portion to be heated and pressurized by the heating and pressurizing unit 120.

The heating and pressurizing unit 120 according to the present exemplary embodiment includes a pressurizing head unit 121 configured to pressurize and heat the compression area G of the FPC film F, and a head motion unit (not illustrated) configured to move the pressurizing head unit 121 towards and away from the compression area G of the FPC film F.

The pressurizing head unit 121 pressurizes and heats the compression area G of the FPC film F. For such heating and pressurization of the FPC film F, a heating unit (not illustrated) is provided on the pressurizing head unit 121. In the present exemplary embodiment, the pressurizing head unit 121 heats the compression area G of the FPC film F at about 250° C. Of course, this heating temperature may vary depending on the specifications of the panel P and FPC film F.

The head motion unit (not illustrated) moves the pressurizing head unit 121 towards and away from the compression area G of the FPC film F. In the present exemplary embodiment, the pressurizing head unit 121 is moved in the up and down directions by the head motion unit, thereby compressing and releasing the compression area G of the FPC film F.

Furthermore, the heating and pressurizing unit 120 according to the present exemplary embodiment may further include a cushion sheet 123 on a lower part of the pressurizing head unit 121. Such a cushion sheet 123 enables a uniform pressure to be applied to the compression area G of the FPC film F when pressurizing by the pressurizing head unit 121.

Meanwhile, the film supporting unit 130 is disposed near the panel supporting unit 110 and supports the FPC film F. Such a film supporting unit 130 is provided with a film pre-heating unit 131 configured to pre-heat the FPC film F.

The film pre-heating unit 131 pre-heats a non-compression area of the FPC film F so as to prevent a temperature difference from occurring between the dummy lead D and real lead R in the compression area that may be caused by a thermal loss through the real lead R of the FPC film F as the compression area G is heated by the heating and pressurizing unit 120.

Due to the pre-heating by the film pre-heating unit 131, the temperature of the real lead R rises from the temperature before the pre-heating, and, therefore, reduces the thermal loss that may occur as the heat transmitted to the compression area G of the FPC film F when the compression area G of the FPC film F is heated by the heating and pressurizing unit 120 is conducted to the non-compression area of the FPC film F through the real lead R.

Such a film pre-heating unit 131 includes a heating unit 132, and a pre-heating temperature adjustment unit 133 configured to adjust the heating temperature of the heating unit 132. In the present exemplary embodiment, the heating unit 132 is realized as an electro-thermal wire but without limitation, and, thus, various heating measures may be used as the heating unit 132 of the present disclosure.

Furthermore, in the present exemplary embodiment, the pre-heating temperature of the film pre-heating unit 131 is lower than the heating temperature of the heating and pressurizing unit 120, and, therefore, prevents the compression area G of the FPC film F from being affected by the thermal conduction through the real lead R before the compression is made by the heating and pressurizing unit 120.

In the present exemplary embodiment, the pre-heating temperature may be about 50° C., but this is merely an exemplary embodiment, and, thus, the specification of the FPC film F and the optimal pre-heating temperature for preventing a temperature variation between the dummy lead D and real lead R in the compression area G when compressed by the heating and pressurizing unit 120 may be determined.

Figure 4:
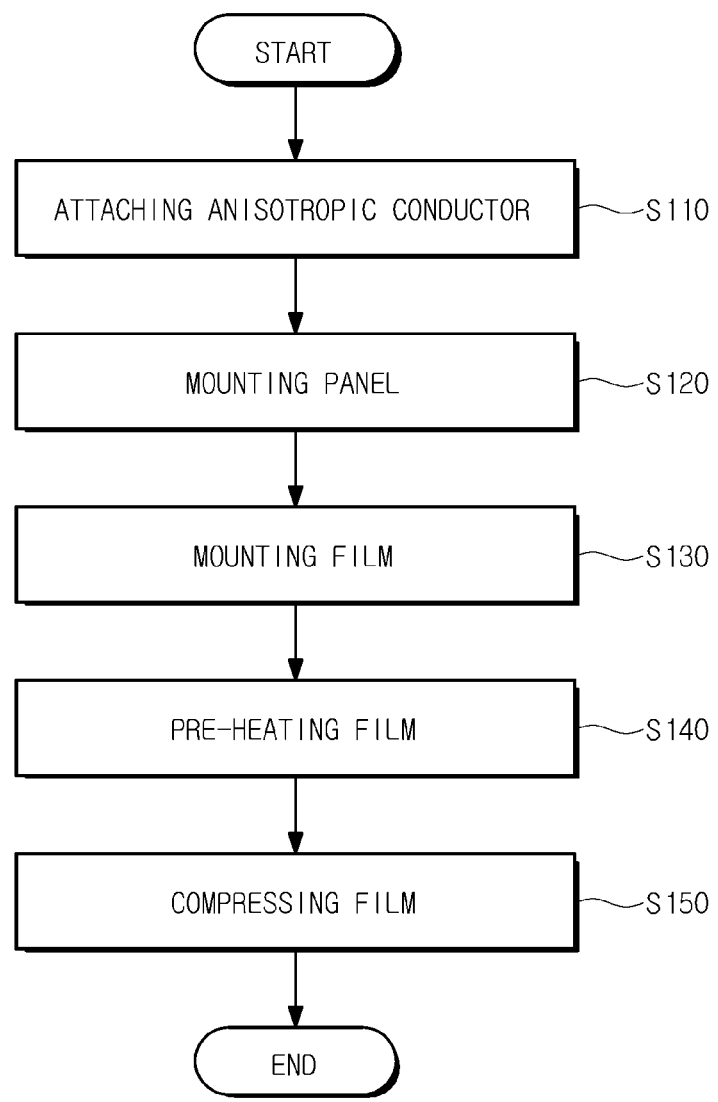
FIG. 4 is a flowchart illustrating a bonding method according to the bonding device of FIG. 2.

FIG. 4 is a flowchart illustrating a bonding method according to the bonding device of FIG. 2.

Hereinafter, the bonding method according to the bonding device of the present embodiment will be explained with reference to FIGS. 2 to 4.

The bonding method according to the present exemplary embodiment of the present disclosure includes a step of attaching an anisotropic conductor to a panel P (S110), a step of mounting the panel P on a panel supporting unit 110 (S120), a step of mounting an FPC film F on a film supporting unit 130 and positioning a compression area G of the FPC film F on an upper part of the anisotropic conductor H (S130), a step of pre-heating the FPC film F mounted on the film supporting unit 130 (S140), and a step of compressing the FPC film F by pressurizing and heating the compression area G of the FPC film F (S150).

At the step of mounting film (S130), the FPC film F is aligned to the anisotropic conductor H such that the compression area G of the FPC film F is precisely positioned on the anisotropic conductor H.

At the step of pre-heating the FPC film F, the FPC film F mounted on the film supporting unit 130 is pre-heated. Herein, the pre-heating temperature of the FPC film F is lower than the heating temperature of the FPC film F at the step of compressing the FPC film F (S150), so that the compression area G of the FPC film F is not affected by the thermal conduction through the real lead R before the compressing is made by the heating and pressurizing unit 120.

At the step of compressing the FPC film F (S150), the pressurizing head unit 121 descends and pressurizes and heats the compression area G of the FPC film F. Herein, because the FPC film F has been pre-heated by the film pre-heating unit 131 (and, thus, the temperature of the real lead R has risen from before the pre-heating), it is possible to reduce the thermal loss that may occur as the heat transmitted to the compression area G of the FPC film F when the compression area G of the FPC film F is heated by the heating and pressurizing unit 120 is conducted to the non-compression area of the FPC film F through the real lead R.

Therefore, at the step of compressing the FPC film F (S150), the thermal loss by the real lead R is minimized, thereby preventing a temperature variation between the dummy lead D and real lead R, and, accordingly, maintaining a constant temperature of the compression area G and improving the bonding quality.

The aforementioned bonding device according to the present embodiment is provided with a film pre-heating unit 131 configured to pre-heat the FPC film F so that a temperature variation does not occur between the dummy lead D and real lead R provided on the FPC film F when the compression area G of the FPC film F is heated by the heating and pressurizing unit 120, thereby improving the bonding quality.

The right of scope of the present disclosure is not limited to the aforementioned embodiments, but may be realized in various types of embodiments within the scope of the claims attached hereto. It will be apparent to one of ordinary skill in the art that various changes in form and details may be made in these embodiments without departing from the spirit and scope of the claims and their equivalents.

It is noted that various individual features of the inventive processes and systems may be described only in one exemplary embodiment herein. The particular choice for description herein with regard to a single exemplary embodiment is not to be taken as a limitation that the particular feature is only applicable to the embodiment in which it is described. All features described herein are equally applicable to, additive, or interchangeable with any or all of the other exemplary embodiments described herein and in any combination or grouping or arrangement. In particular, use of a single reference numeral herein to illustrate, define, or describe a particular feature does not mean that the feature cannot be associated or equated to another feature in another drawing figure or description. Further, where two or more reference numerals are used in the figures or in the drawings, this should not be construed as being limited to only those embodiments or features, they are equally applicable to similar features or not a reference numeral is used or another reference numeral is omitted.

The foregoing description and accompanying drawings illustrate the principles, exemplary embodiments, and modes of operation of the systems and methods. However, the systems and methods should not be construed as being limited to the particular embodiments discussed above. Additional variations of the embodiments discussed above will be appreciated by those skilled in the art and the above-described embodiments should be regarded as illustrative rather than restrictive. Accordingly, it should be appreciated that variations to those embodiments can be made by those skilled in the art without departing from the scope of the systems and methods as defined by the following claims.

What is claimed is:

1. A bonding method, which comprises:
   attaching an anisotropic conductor to a display panel;
   mounting the display panel on a panel supporting unit;
   mounting an FPC film on the film supporting unit and positioning a compression area of the FPC film on an upper part of the anisotropic conductor;
   pre-heating a non-compression area of the FPC film mounted on the film supporting unit; and
   compressing the FPC film by heating and pressurizing the compression area of the FPC film,
   wherein a dummy lead and a real lead are provided on the FPC film, the real lead extends from the compression area to the non-compression area, the dummy lead does not extend from the compression area to the non-compression area, and the real lead is only pre-heated at the step of pre-heating.

2. The method according to claim 1, which further comprises, at the step of pre-heating the FPC film, pre-heating the FPC film to a pre-heating temperature that is lower than a heating temperature of the FPC film at the step of compressing the FPC film.

\* \* \* \* \*